United States Patent
Horii (10) Patent No.: US 8,609,513 B2
(45) Date of Patent: Dec. 17, 2013

(54) METHOD FOR MANUFACTURING SEMICONDUCTOR DEVICE

(75) Inventor: Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/510,570

(22) PCT Filed: Jul. 21, 2011

(86) PCT No.: PCT/JP2011/066564
§ 371 (c)(1),
(2), (4) Date: May 17, 2012

(87) PCT Pub. No.: WO2012/035880
PCT Pub. Date: Mar. 22, 2012

(65) Prior Publication Data
US 2012/0225537 A1  Sep. 6, 2012

(30) Foreign Application Priority Data
Sep. 16, 2010  (JP) .................................. 2010-207873

(51) Int. Cl.
H01L 21/78 (2006.01)
H01L 21/46 (2006.01)
H01L 21/76 (2006.01)
H01L 21/50 (2006.01)

(52) U.S. Cl.
USPC ............ 438/464; 438/460; 438/458; 438/113

(58) Field of Classification Search
USPC .................. 438/113, 458, 460, 464
See application file for complete search history.

(56) References Cited

U.S. PATENT DOCUMENTS

| | | | |
|---|---|---|---|
| 7,547,578 B2 * | 6/2009 | Agarwal et al. | 438/113 |
| 2006/0073707 A1 | 4/2006 | Powell et al. | |
| 2006/0075958 A1 | 4/2006 | Powell et al. | |
| 2007/0057337 A1 * | 3/2007 | Kano et al. | 257/431 |
| 2007/0082486 A1 * | 4/2007 | Yang et al. | 438/666 |
| 2007/0209577 A1 | 9/2007 | Powell et al. | |
| 2008/0219309 A1 * | 9/2008 | Hata et al. | 372/44.01 |

FOREIGN PATENT DOCUMENTS

| | | |
|---|---|---|
| JP | 2003-303877 A | 10/2003 |
| JP | 2009-272473 A | 11/2009 |
| JP | 2011-066371 A | 3/2011 |

* cited by examiner

*Primary Examiner* — Luan C Thai
(74) *Attorney, Agent, or Firm* — Venable LLP; Michael A. Sartori (57) ABSTRACT

A method for manufacturing a semiconductor device includes the steps of: preparing a combined wafer; obtaining a first intermediate wafer by forming an active layer; obtaining a second intermediate wafer by forming a front-side electrode on the first intermediate wafer; supporting the second intermediate wafer by adhering an adhesive tape at the front-side electrode side; removing the supporting layer while supporting the second intermediate wafer using the adhesive tape; forming a backside electrode on the main surfaces of SiC substrates exposed by the removal of the supporting layer; adhering an adhesive tape at the backside electrode side and removing the adhesive tape at the front-side electrode side so as to support the plurality of SiC substrates using the adhesive tape; and obtaining a plurality of semiconductor devices by cutting the SiC substrates with the SiC substrates being supported by the adhesive tape provided at the backside electrode side.

10 Claims, 4 Drawing Sheets

METHOD FOR MANUFACTURING SEMICONDUCTOR DEVICE

TECHNICAL FIELD

The present invention relates to a method for manufacturing a semiconductor device, more particularly, a method for manufacturing a semiconductor device using a silicon carbide substrate.

BACKGROUND ART

In recent years, in order to achieve high breakdown voltage, low loss, and utilization of semiconductor devices under a high temperature environment, silicon carbide (SiC) has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

In order to efficiently manufacture such semiconductor devices, it is effective to use a substrate having a large diameter. Accordingly, various studies have been conducted on silicon carbide substrates made of single-crystal silicon carbide and having a diameter of 3 inches or 4 inches as well as methods for manufacturing such silicon carbide substrates. For example, methods for manufacturing such silicon carbide substrates using a sublimation method have been proposed (for example, see U.S. Patent Application Publication No. 2006/0073707 (Patent Literature 1), U.S. Patent Application Publication No. 2007/0209577 (Patent Literature 2), and U.S. Patent Application Publication No. 2006/0075958 (Patent Literature 3)).

CITATION LIST

Patent Literature

PTL 1: US Patent Application Publication No. 2006/0073707
PTL 2: US Patent Application Publication No. 2007/0209577
PTL 3: US Patent Application Publication No. 2006/0075958

SUMMARY OF INVENTION

Technical Problem

In order to manufacture semiconductor devices more efficiently, it is required to provide a silicon carbide substrate with a larger diameter (4 inches or greater, for example). Here, in order to fabricate a silicon carbide substrate having a large diameter using the sublimation method, temperature needs to be uniform in a wide area thereof. However, because the growth temperature of silicon carbide in the sublimation method is high, specifically, not less than 2000° C., it is difficult to control the temperature. Hence, it is not easy to have a wide area in which temperature is uniform. Accordingly, even when the sublimation method, which relatively readily allows for a large diameter, is used, it is not easy to fabricate a silicon carbide substrate excellent in crystallinity and having a large diameter (for example, 4 inches or greater).

Hence, it is difficult to improve efficiency in manufacturing semiconductor devices using the silicon carbide substrate, disadvantageously.

In view of this, an object of the present invention is to provide a method for manufacturing a semiconductor device, so as to achieve improved efficiency in manufacturing semiconductor devices using a silicon carbide substrate.

Solution to Problem

A method for manufacturing a semiconductor device in the present invention includes the steps of: preparing a combined wafer in which a plurality of SiC substrates each made of silicon carbide single-crystal are arranged side by side when viewed in a planar view and main surfaces of the plurality of SiC substrates at one side are connected to each other by a supporting layer (a combined wafer in which the plurality of SiC substrates are arranged side by side along a main surface of the supporting layer); fabricating a first intermediate wafer by forming an active layer on each of the SiC substrates of the combined wafer; fabricating a second intermediate wafer by forming a front-side electrode on the active layer of the first intermediate wafer; supporting the plurality of SiC substrates using an adhesive tape with the plurality of SiC substrates being arranged side by side when viewed in a planar view, by adhering to the adhesive tape a main surface of the second intermediate wafer on which the front-side electrode is formed; and removing the supporting layer while supporting the plurality of SiC substrates of the second intermediate wafer using the adhesive tape with the plurality of SiC substrates being arranged side by side when viewed in a planar view. The method for manufacturing the semiconductor device in the present invention further includes the steps of: forming a backside electrode on the main surfaces of the SiC substrates exposed by the removal of the supporting layer; adhering an adhesive tape at the side thereof on which the backside electrode is formed, and removing the adhesive tape from at the side thereof on which the front-side electrode is formed, so as to support the plurality of SiC substrates using the adhesive tape with the plurality of SiC substrates being arranged side by side when viewed in a planar view; and obtaining a plurality of semiconductor devices by cutting the SiC substrates in a thickness direction thereof while the SiC substrates are supported by the adhesive tape provided at the side on which the backside electrode is formed, with the SiC substrates being arranged side by side when viewed in a planar view.

In the method for manufacturing the semiconductor device in the present invention, the combined wafer is prepared which has the plurality of SiC substrates each made of silicon carbide single-crystal, arranged side by side when viewed in a planar view, and each having one main surface connected to the supporting layer. As described above, it is difficult for a substrate made of single-crystal silicon carbide to keep its high quality and have a large diameter. To address this, a plurality of high-quality quality SiC substrates each having a small diameter and obtained from a silicon carbide single-crystal are arranged side by side when viewed in a planar view and they are connected to one another using a supporting layer having a large diameter, thereby obtaining a combined wafer that is excellent in crystallinity and can be handled as a silicon carbide substrate having a large diameter. Use of such a combined wafer having the large diameter allows for efficient manufacturing of semiconductor devices.

Here, an exemplary, usable supporting layer is a layer constituted by a silicon carbide substrate having a quality such as crystallinity lower than that of each of the above-described SiC substrates, or a layer made of a metal. In the case where it is preferable not to include such a supporting layer in each of the semiconductor devices to be obtained finally, the supporting layer can be removed in the manufacturing process. However, if the supporting layer connecting the plurality of SiC substrates to one another is removed without taking any necessary measure, the plurality of SiC substrates will be separated from one another to hinder efficient manufacturing of semiconductor devices.

To address this, in the method for manufacturing the semiconductor device in the present invention, the supporting layer is removed while supporting the second intermediate wafer by the adhesive tape with the plurality of SiC substrates being arranged side by side when viewed in a planar view. Thereafter, until the step of obtaining the plurality of semiconductor devices by cutting the SiC substrates in the thickness direction thereof, the plurality of SiC substrates are supported by the adhesive tape with the SiC substrates being arranged side by side when viewed in a planar view. Accordingly, the plurality of SiC substrates are avoided from being separated from one another, thereby allowing for efficient manufacturing of semiconductor devices.

As described above, according to the method for manufacturing the semiconductor device in the present invention, the efficiency of manufacturing the semiconductor devices using the silicon carbide substrate can be improved.

It should be noted that the active layer is a layer directly contributing to an intended operation of the semiconductor device. An example thereof is an epitaxial growth layer having regions having conductivity types different from each other.

In the method for manufacturing the semiconductor device, the step of forming the backside electrode may include the steps of: forming a metal layer on the main surfaces of the SiC substrates exposed by the removal of the supporting layer; and heating the metal layer. In this way, the backside electrode capable of forming ohmic contact with the SiC substrates can be readily formed.

In the method for manufacturing the semiconductor device, in the step of heating the metal layer, the front-side electrode may have a temperature maintained at 180° C. or smaller. Accordingly, the adhesive tape does not need to have a high heat resistance, thereby providing a wider range of choices for a material for the adhesive tape. Hence, a general resin tape can be employed as the above-described adhesive tape, for example.

Preferably, in the method for manufacturing the semiconductor device, in the step of heating the metal layer, the metal layer is locally heated. In other words, in the step of heating the metal layer, it is preferable to heat the metal layer while restraining increase of the temperature of a region adjacent to the metal layer.

In the method for manufacturing the semiconductor device in the present invention, the front-side electrode is formed before forming the backside electrode. Further, a wire made of a metal such as Al (aluminum) having a relatively low melting point may be connected to the front-side electrode. Hence, the metal layer is preferably locally heated to suppress damage on the wire or the like.

In the method for manufacturing the semiconductor device, in the step of heating the metal layer, the metal layer may be locally heated by irradiating the metal layer with a laser. The local heating for the metal layer can be readily implemented by employing the laser irradiation, which provides an irradiation range that can be readily limited.

In the method for manufacturing the semiconductor device, the laser may have a wavelength of 355 nm. If the wavelength of the laser is too long, the laser is not sufficiently absorbed in the metal layer, which makes it difficult to appropriately heat the metal layer. Moreover, in the case where the metal layer has a defect portion such as a pinhole, the laser is not absorbed not only in the metal layer but also in the SiC substrates and the active layer both made of silicon carbide. Accordingly, the laser having passed through the SiC substrates and the active layer may damage the front-side electrode, a surrounding device, and the like, disadvantageously. On the other hand, if the wavelength of the laser is too short, a laser having a high output with low cost may be less likely to be obtained, disadvantageously. Further, the laser having a wavelength of 355 nm can be oscillated relatively readily. The laser having a wavelength of 355 nm can be readily generated by, for example, an YAG (Yttrium Aluminum Garnet) laser device.

The method for manufacturing the semiconductor device may further include the step of replacing, after the step of forming the metal layer and before the step of heating the metal layer, the adhesive tape provided at the side of the SiC substrates on which the front-side electrode is formed, while maintaining the state in which the plurality of SiC substrates are arranged side by side when viewed in a planar view. Further, the method for manufacturing the semiconductor device may further include the step of replacing, after the step of removing the supporting layer and before the step of forming the backside electrode, the adhesive tape provided at the side of the SiC substrates on which the front-side electrode is formed, while maintaining the state in which the plurality of SiC substrates are arranged side by side when viewed in a planar view.

By appropriately replacing the adhesive tape in this way, an adhesive tape suitable for a subsequent process can be used. In particular, the adhesive tape is desirably replaced in the case where damage or decrease of adhesive force took place in the adhesive tape in a previous step, or in the case where there is an adhesive tape particularly suitable for a subsequent step.

In the method for manufacturing the semiconductor device, as the adhesive tape, an adhesive tape having adhesive force to be reduced when being irradiated with ultraviolet rays may be used. Further, in the method for manufacturing the semiconductor device, as the adhesive tape, an adhesive tape having adhesive force to be reduced when being heated may be used.

By thus employing the adhesive tape having adhesive force which can be reduced as required, the method for manufacturing the semiconductor device in the present invention can be performed smoothly.

In the method for manufacturing the semiconductor device in the present invention, in the step of preparing the combined wafer, there may be prepared a combined wafer in which each of the SiC substrates may have a main surface opposite to the supporting layer and having an off angle of not less than 50° and not more than 65° relative to a {0001} plane.

By growing single-crystal silicon carbide of hexagonal system in the <0001> direction, a high-quality single-crystal can be fabricated efficiently. From such a silicon carbide single-crystal grown in the <0001> direction, a silicon carbide substrate having a main surface corresponding to the {0001} plane can be obtained efficiently. Meanwhile, by using a silicon carbide substrate having a main surface having an off angle of not less than 50° and not more than 65° relative to the plane orientation of {0001}, a semiconductor device with high performance may be manufactured.

Specifically, for example, it is general that a silicon carbide substrate used in fabricating a MOSFET (Metal Oxide Semiconductor Field Effect Transistor) has a main surface having an off angle of approximately 8° relative to the plane orientation of {0001}. An epitaxial growth layer to serve as an active layer is formed on this main surface and an oxide film, an electrode, and the like are formed on this epitaxial growth layer, thereby obtaining a MOSFET. In this MOSFET, a channel region is formed in a region including an interface between the epitaxial growth layer and the oxide film. However, in the MOSFET having such a structure, a multiplicity of interface states are formed around the interface between the epitaxial growth layer and the oxide film, i.e., the location in which the channel region is formed, due to the substrate's main surface having an off angle of approximately 8° relative to the {0001} plane. This hinders traveling of carriers, thus decreasing channel mobility.

To address this, in the step of preparing the combined wafer, the main surface of each of the SiC substrates opposite to the supporting layer is adapted to have an off angle of not less than 50° and not more than 65° relative to the {0001} plane, thereby reducing formation of the interface states. In this way, a semiconductor device such as a MOSFET can be fabricated which allows for reduced on-resistance.

In the method for manufacturing the semiconductor device in the present invention, in the step of preparing the combined wafer, a combined wafer may be prepared in which the main surface of each of the SiC substrates opposite to the supporting layer has an off orientation forming an angle of 5° or smaller relative to the <01-10> direction.

The <01-10> direction is a representative off orientation in a SiC substrate. Variation in the off orientation resulting from variation in the slicing process of the process of manufacturing the SiC substrate is adapted to be 5° or smaller, which allows an epitaxial growth layer to be formed readily on the SiC substrate.

In the method for manufacturing the semiconductor device in the present invention, in the step of preparing the combined wafer, there may be prepared a combined wafer in which the main surface of each of the SiC substrates opposite to the supporting layer has an off angle of not less than −3° and not more than 5° relative to the {0-33-8} plane in the <01-10> direction.

Accordingly, channel mobility can be further improved in the case where a MOSFET is fabricated using the silicon carbide substrate. Here, setting the off angle at not less than −3° and not more than +5° relative to the plane orientation of {0-33-8} is based on a fact that particularly high channel mobility was obtained in this set range as a result of inspecting a relation between the channel mobility and the off angle.

Further, the "off angle relative to the {0-33-8} plane in the <01-10> direction" refers to an angle formed by an orthogonal projection of a normal line of the above-described main surface to a flat plane including the <01-10> direction and the <0001> direction, and a normal line of the {0-33-8} plane. The sign of positive value corresponds to a case where the orthogonal projection approaches in parallel with the <01-10> direction whereas the sign of negative value corresponds to a case where the orthogonal projection approaches in parallel with the <0001> direction.

It should be noted that the main surface preferably has a plane orientation of substantially {0-33-8}, and the main surface more preferably has a plane orientation of {0-33-8}. Here, the expression "the main surface has a plane orientation of substantially {0-33-8}" is intended to encompass a case where the plane orientation of the main surface of the substrate is included in a range of off angle such that the plane orientation can be substantially regarded as {0-33-8} in consideration of processing accuracy of the substrate. In this case, the range of off angle is, for example, a range of off angle of ±2° relative to {0-33-8}. Accordingly, the above-described channel mobility can be further improved.

Further, the main surface of each of the SiC substrates opposite to the supporting layer with the off angle of not less than 50° and not more than 65° relative to the {0001} plane preferably corresponds to a plane of the carbon plane side. Accordingly, channel mobility can be further improved in the case where a MOSFET or the like is fabricated as the semiconductor device, for example. Here, the (0001) plane of single-crystal silicon carbide of hexagonal crystal is defined as the silicon plane whereas the (000-1) plane is defined as the carbon plane. In other words, when employing the configuration in which the off orientation of the main surface forms an angle of 5° or smaller relative to the <01-10> direction, the channel mobility is further improved by adapting the main surface to correspond to a plane close to the (0-33-8) plane.

In the method for manufacturing the semiconductor device in the present invention, in the step of preparing the combined wafer, there may be prepared a combined wafer in which the main surface of each of the SiC substrates opposite to the supporting layer has an off orientation forming an angle of 5° or smaller relative to the <−2110> direction.

The <−2110> direction is a representative off orientation in a SiC substrate, as with the <01-10> direction. Variation in the off orientation resulting from variation in the slicing process of the process of manufacturing the SiC substrate is adapted to be ±5°, which allows an epitaxial growth layer to be formed readily on the SiC substrate.

Advantageous Effects of Invention

As apparent from the description above, according to the method for manufacturing the semiconductor device in the present invention, there can be provided a method for manufacturing a semiconductor device, whereby efficiency of manufacturing semiconductor devices using a silicon carbide substrate can be improved.

DESCRIPTION OF EMBODIMENTS

The following describes an embodiment of the present invention with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

Figure 1:
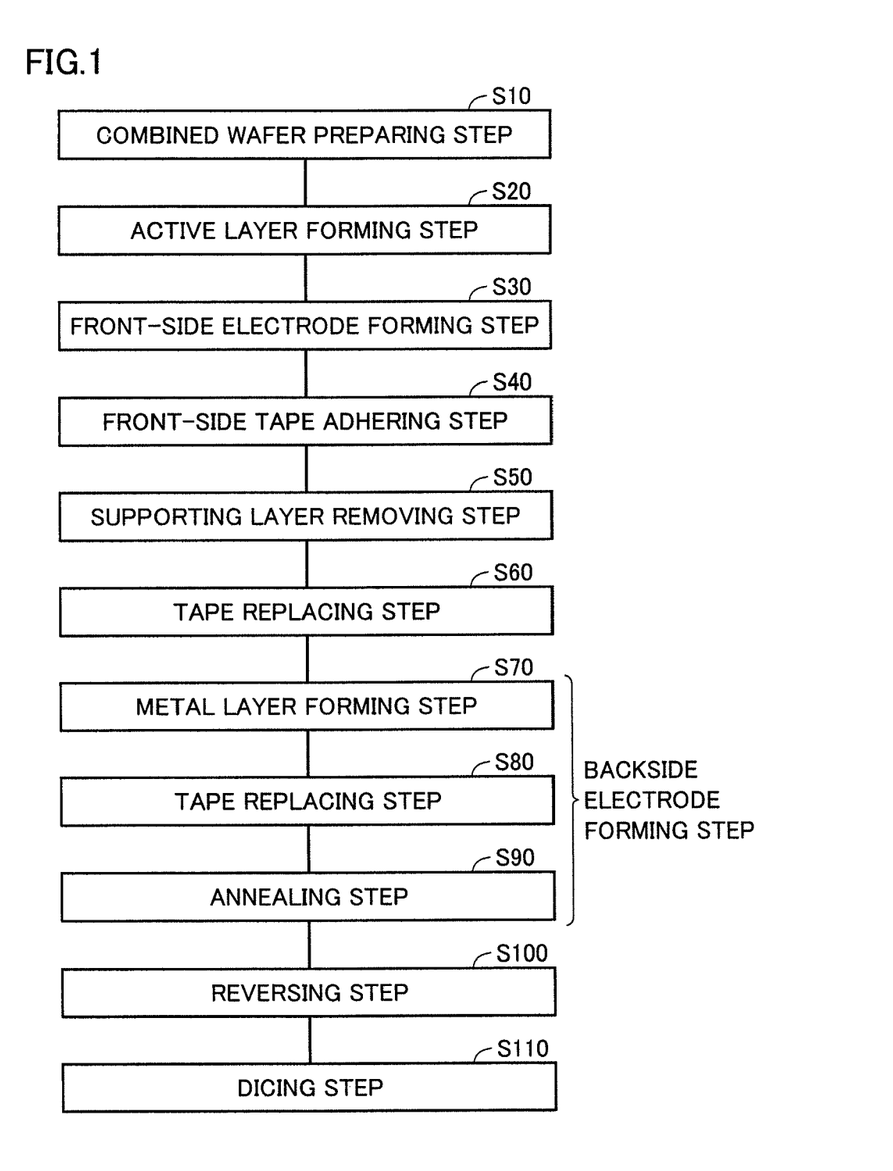
FIG. 1 is a flowchart schematically showing a method for manufacturing a semiconductor device.

Referring to FIG. 1, in a method for manufacturing a semiconductor device in the present embodiment that is one embodiment of the present invention, a combined wafer preparing step is first performed as a step (S10). In this step (S10), referring to FIG. 2, a combined wafer 10 is prepared in which a plurality of SiC substrates 22 each made of silicon carbide single-crystal are arranged side by side when viewed in a planar view and main surfaces of the plurality of SiC substrates 22 at one side are connected to each other by supporting layer 21. An exemplary SiC substrate 22 employable is a substrate made of hexagonal silicon carbide such as 4H—SiC. Meanwhile, for supporting layer 21, a substrate made of a metal may be employed. However, it is preferable to employ a substrate made of silicon carbide in order to suppress warpage resulting from a difference in physical property such as thermal expansion coefficient. As the silicon carbide constituting supporting layer 21, polycrystal silicon carbide or amorphous silicon carbide can be employed, but it is preferable to employ silicon carbide single-crystal of hexagonal silicon carbide such as 4H—SiC.

Next, an active layer forming step is performed as a step (S20). In this step (S20), referring to FIG. 2 and FIG. 3, an active layer 23 is formed on each of SiC substrates 22 of combined wafer 10, thereby fabricating a first intermediate wafer 11. Specifically, for example, an epitaxial growth layer made of silicon carbide is formed on each of SiC substrates 22. Thereafter, regions having impurities introduced therein by means of, for example, ion implantation are formed in the epitaxial growth layer. Thereafter, activation annealing is performed to form a plurality of regions having different conductivity type in the epitaxial growth layer. Accordingly, active layer 23 contributing to a predetermined operation of the semiconductor device is obtained.

Figure 3:
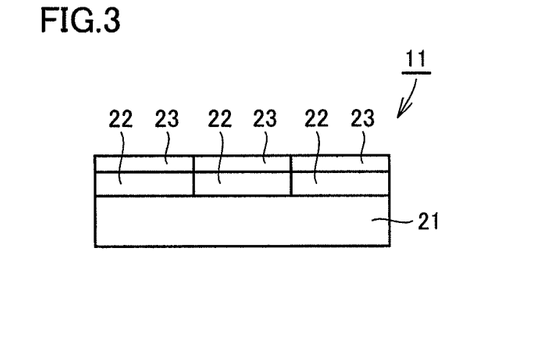
FIG. 3 is a schematic cross sectional view for illustrating the method for manufacturing the semiconductor device.
Figure 4:
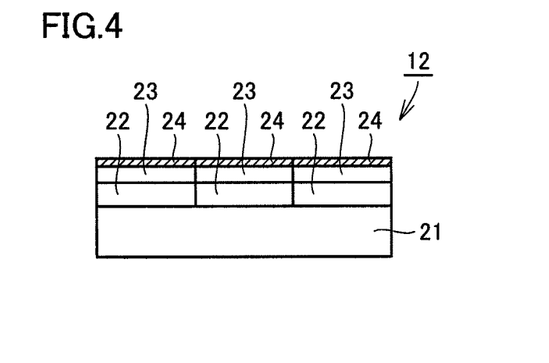
FIG. 4 is a schematic cross sectional view for illustrating the method for manufacturing the semiconductor device.

Next, as a step (S30), a front-side electrode forming step is performed. In this step (S30), referring to FIG. 3 and FIG. 4, a front-side electrode 24 is formed on active layer 23 of first intermediate wafer 11, thereby fabricating a second intermediate wafer 12. Specifically, examples of such an electrode formed on active layer 23 include: a gate electrode made of polysilicon and disposed on a gate insulating film provided on active layer 23; a source electrode made of nickel and disposed in contact with active layer 23; and the like.

Figure 5:
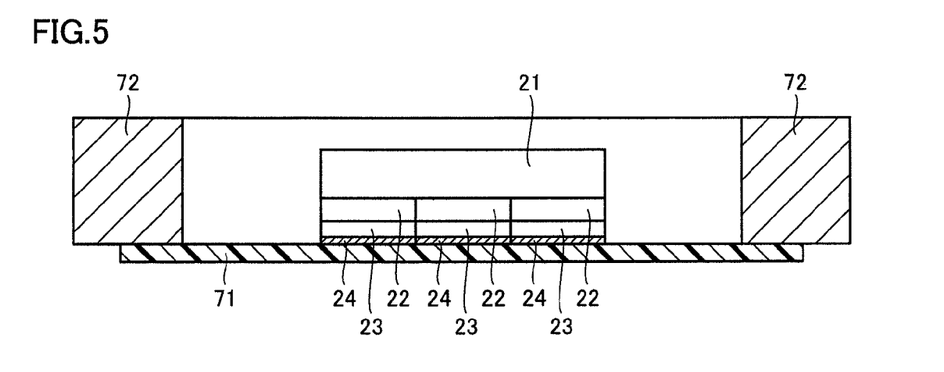
FIG. 5 is a schematic cross sectional view for illustrating the method for manufacturing the semiconductor device.

Next, a front-side tape adhering step is performed as a step (S40). In this step (S40), an adhesive tape is adhered to the main surface of second intermediate wafer 12 on which front-side electrode 24 is formed, whereby the plurality of SiC substrates 22 are supported by the adhesive tape with SiC substrates 22 being arranged side by side when viewed in a planar view. Specifically, referring to FIG. 5, first, an annular ring frame 72 made of a metal is prepared. Next, adhesive tape 71 is set and held at ring frame 72 to close a hole extending through ring frame 72. With adhesive tape 71 being thus held by ring frame 72, adhesive tape 71 is securely provided with surface smoothness. Next, second intermediate wafer 12 is put on adhesive tape 71 for adhesion such that its main surface having front-side electrode 24 formed thereon comes into contact with the adhesive surface of adhesive tape 71. As a result, second intermediate wafer 12, which is thus adhered to adhesive tape 71, is held at a location surrounded by the inner circumference surface of ring frame 72. It should be noted that adhesive tapes having various configurations can be employed as adhesive tape 71, and an exemplary, usable adhesive tape is one which employs polyester for a base material thereof, employs an acrylic adhesive agent, PET (Poly Ethylene Terephthalate), or polyolefin as an adhesive agent thereof, and employs PET for a separator thereof. Further, adhesive tape 71 preferably has a thickness of 150 µm or smaller.

Figure 6:
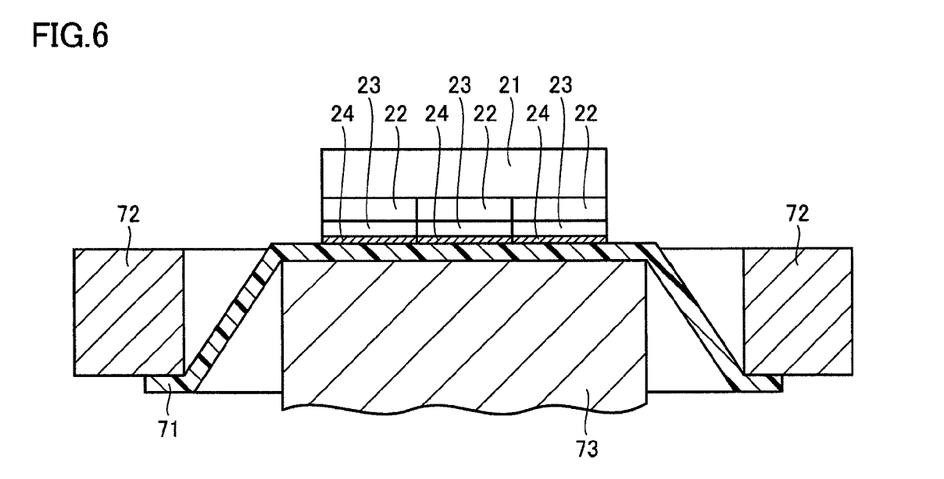
FIG. 6 is a schematic cross sectional view for illustrating the method for manufacturing the semiconductor device.
Figure 7:
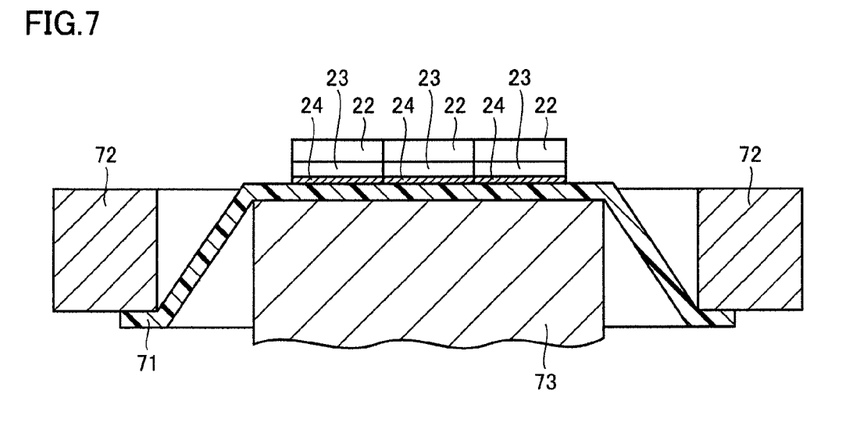
FIG. 7 is a schematic cross sectional view for illustrating the method for manufacturing the semiconductor device.

Next, as a step (S50), a supporting layer removing step is performed. In this step (S50), supporting layer 21 is removed while the plurality of SiC substrates 22 of second intermediate wafer 12 are supported by adhesive tape 71 with SiC substrates 22 being arranged side by side when viewed in a planar view. Specifically, referring to FIG. 6, the main surface of adhesive tape 71 opposite to its side holding second intermediate wafer 12 is pressed by a pressing member 73 in the axial direction of ring frame 72. Accordingly, adhesive tape 71 is elastically deformed, whereby at least supporting layer 21 of second intermediate wafer 12 held by adhesive tape 71 is deviated from the location surrounded by the inner circumference surface of ring frame 72. Then, supporting layer 21 is pressed against a grinding surface of a grinding device such as a grinder (not shown), thereby grinding supporting layer 21. Accordingly, supporting layer 21 is removed as shown in FIG. 7. In doing so, a portion of each of SiC substrates 22 may be removed by the grinding. Further, after the removal of supporting layer 21, a total value of the thickness of each SiC substrate and the thickness of active layer 23 can be 150 µm or smaller. In this way, semiconductor devices to be fabricated will have reduced on-resistance.

Next, as a step (S60), a tape replacing step is performed. In this step, adhesive tape 71 is replaced after completing step (S50) by finishing the pressing of adhesive tape 71 by pressing member 73. This step (S60) is not an essential step in the method for manufacturing the semiconductor device in the present invention, but a defect resulting from damage on adhesive tape 71 can be avoided in advance by replacing adhesive tape 71, which might be damaged in step (S50) as a result of the elastic deformation or the like.

Figure 8:
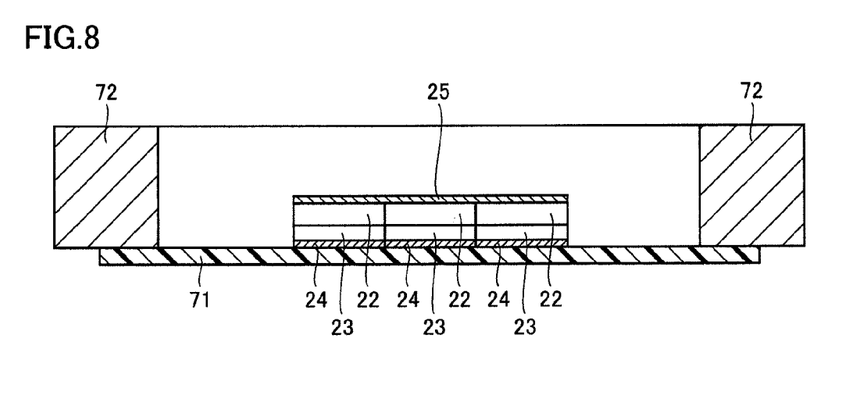
FIG. 8 is a schematic cross sectional view for illustrating the method for manufacturing the semiconductor device.

Next, referring to FIG. 1, a backside electrode forming step is performed. In this step, a backside electrode is formed on the main surfaces of SiC substrates 22 exposed by the removal of the supporting layer in step (S50). This backside electrode forming step includes a metal layer forming step performed as a step (S70), and a tape replacing step performed as a step (S80), and an annealing step performed as a step (S90). In step (S70), referring to FIG. 8, a metal layer made of a metal such as nickel is formed on the main surfaces of SiC substrates 22 opposite to the side on which active layer 23 is formed. This metal layer can be formed using sputtering, for example. On this occasion, adhesive tape 71, ring frame 72, and the wafer may be cooled using a cooling structure (not shown) as required.

Next, in step (S80), adhesive tape 71 is replaced after completion of step (S70). This step (S80) is not an essential step in the method for manufacturing the semiconductor device in the present invention, but a defect resulting from damage or the like on adhesive tape 71 can be avoided in advance by replacing adhesive tape 71, which might be damaged in the processes up to step (S70), or by replacing it with another adhesive tape 71 suitable for a below-described step (S90).

Next, in step (S90), the metal layer formed in step (S70) is heated. Specifically, referring to FIG. 8, when the metal layer made of, for example, nickel is formed in step (S70), regions of the metal layer in contact with at least SiC substrates 22 are silicided by the heating in step (S90), thereby obtaining a backside electrode 25 making ohmic contact with SiC substrates 22.

Figure 9:
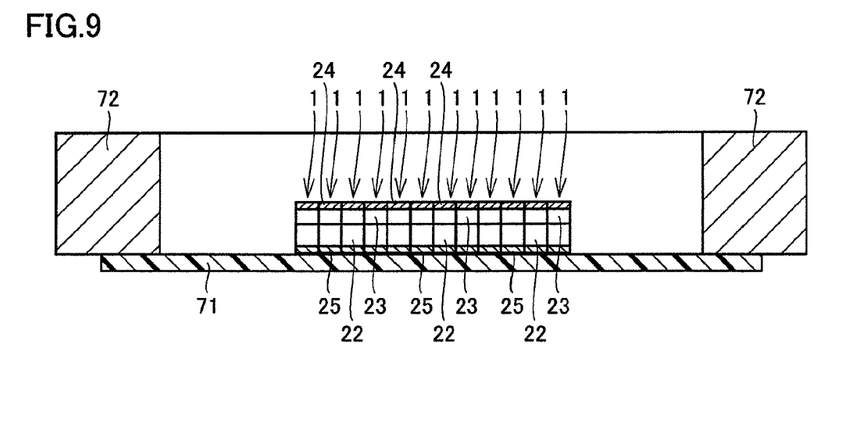
FIG. 9 is a schematic cross sectional view for illustrating the method for manufacturing the semiconductor device.

Next, a reversing step is performed as a step (S100). In this step (S100), referring to FIG. 8 and FIG. 9, an adhesive tape is adhered to the side on which backside electrode 25 is formed, and the adhesive tape at the front-side electrode 24 side is removed. Accordingly, the plurality of SiC substrates 22 are supported by adhesive tape 71 with SiC substrates 22 being arranged side by side when viewed in a planar view. Accordingly, as shown in FIG. 9, the wafer is held by adhesive tape 71 with the wafer being reversed from the state shown in step (S90). As a result, the front-side surface of the wafer can be observed, whereby the next step (S110) can be readily performed.

Next, as step (S110), a dicing step is performed. In this step (S110), referring to FIG. 9, SiC substrates 22 supported by adhesive tape 71 at the backside electrode 25 side are cut (diced) in the thickness direction thereof with SiC substrates 22 being arranged side by side when viewed in a planar view. In this way, a plurality of semiconductor devices 1 are obtained. It should be noted that this cutting may be performed by means of laser dicing or scribing.

Figure 2:
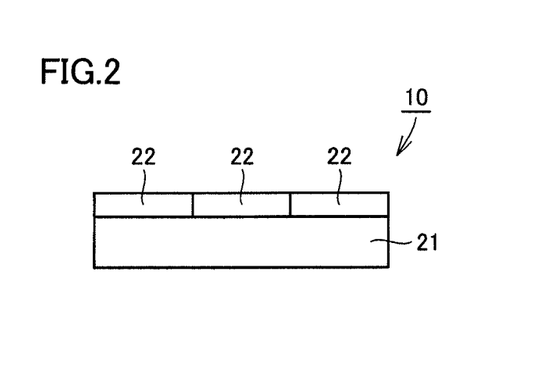
FIG. 2 is a schematic cross sectional view for illustrating the method for manufacturing the semiconductor device.

Here, in the method for manufacturing semiconductor device 1 in the present embodiment, combined wafer 10 is prepared which has the plurality of SiC substrates 22 each made of silicon carbide single-crystal, arranged side by side when viewed in a planar view, and each having one main surface connected to supporting layer 21 (see FIG. 2). Such a combined wafer 10 can be handled as a silicon carbide substrate having excellent crystallinity and having a large diameter. Use of combined wafer 10 allows for efficient manufacturing of semiconductor devices 1.

Further, in the method for manufacturing semiconductor device 1 in the present embodiment, supporting layer 21 is removed while second intermediate wafer 12 is supported using adhesive tape 71. Further, the plurality of SiC substrates 22 are kept on being supported by adhesive tape 71 with SiC substrates 22 being arranged side by side when viewed in a planar view until SiC substrates 22 are cut to obtain the plurality of semiconductor devices 1 in the subsequent step (S110). As a result, the plurality of SiC substrates 22 are avoided from being separated from one another, thereby allowing for efficient manufacturing of semiconductor devices 1.

Further, the wafer (SiC substrates 22) has been thinned due to the removal of supporting layer 21 to thereby have decreased hardness. However, in the above-described manufacturing method, the wafer is reinforced by adhesive tape 71 while being held, thereby restraining damage on the wafer during the process. Further, the wafer having been thinned due to the removal of supporting layer 21 and thus adhered to adhesive tape 71 held by ring frame 72 is transferred between devices for performing the above-described steps. Accordingly, the wafer can be smoothly transferred between the devices.

Thus, in the method for manufacturing the semiconductor device in the present embodiment, the process is simple and manufacturing efficiency is excellent. Hence, the manufacturing method is suitable for mass production of semiconductor devices.

Here, the replacement of adhesive tape 71 in each of step (S60) and step (S80) can be implemented as follows. First, the plurality of SiC substrates 22 arranged side by side when viewed in a planar view are held by an adsorbing member. Thereafter, the adhesive tape is detached and then a new adhesive tape is adhered. Thereafter, the adsorption by the adsorbing member is terminated.

In addition, the adhering and removal of adhesive tape 71 in each of steps (S60), (S80), (S100), and the like may be automated.

Further, in the above-described step (S90), front-side electrode 24 may have a temperature maintained at 180° C. or smaller. Hence, the adhesive tape does not need to have a high heat resistance, thereby providing a wider range of choices for a material for the adhesive tape. Thus, a general resin tape can be employed as the above-described adhesive tape, for example.

Further, in step (S90), it is preferable to locally heat the metal layer. This achieves suppressed damage on a wire formed in step (S30), adhesive tape 71, and the like. This local heating may be attained by laser irradiation for the metal layer. In this way, the local heating can be readily done.

Further, the above-described laser preferably has a wavelength of 355 nm. In this way, even in the case where the metal layer has a defect portion such as a pinhole, the metal layer can be appropriately heated while suppressing damage on front-side electrodes 24, a surrounding device, and the like.

Further, as the laser, a pulse laser having a pulse width of not less than 10 nsec and not more than 50 nsec can be employed. Further, the laser can be adapted to have an energy density of not less than 0.5 J/cm$^2$ and not more than 2 J/cm$^2$. If the energy density is less than 0.5 J/cm$^2$, the energy will be insufficient to result in insufficient heating. Accordingly, sufficient ohmic contact may not be obtained. On the other hand, if the energy density is more than 2 J/cm$^2$, surface ablation may take place to result in scattering of an electrode, increased resistance, and the like, disadvantageously.

Further, for the adhesive tape of the present embodiment, there may be used an adhesive tape (UV tape) having adhesive force to be reduced when irradiated with ultraviolet rays, or an adhesive tape having adhesive force to be reduced when being heated. By thus employing the adhesive tape having its adhesive force which can be reduced as required, the above-described manufacturing process can be performed smoothly.

Further, in step (S10), combined wafer 10 may be prepared in which the main surface of each SiC substrate 22 opposite to supporting layer 21 may have an off angle of not less than 50° and not more than 65° relative to the {0001} plane. In this way, for example, when a channel region is formed in the vicinity of an interface between active layer 23 formed in step (S20) and the gate oxide film formed on active layer 23, formation of interface states are suppressed in the vicinity of the interface. Accordingly, semiconductor device 1 having reduced on-resistance can be manufactured.

Further, in step (S10), combined wafer 10 may be prepared in which the main surface of each SiC substrate 22 opposite to supporting layer 21 has an off orientation forming an angle of 5° or smaller relative to the <01-10> direction. In this way, an epitaxial growth layer or the like can be formed readily on SiC substrate 22. Further, the main surface of SiC substrate 22 opposite to supporting layer 21 may have an off angle of not less than −3° and not more than 5° relative to the {0-33-8} plane in the <01-10> direction. In this way, there can be obtained semiconductor device 1 in which the formation of interface states can be further suppressed to achieve further reduced on-resistance. Further, the main surface of SiC substrate 22 opposite to supporting layer 21 is adapted to correspond to a plane of the carbon plane side, whereby semiconductor device 1 having further reduced on-resistance can be manufactured.

Meanwhile, in step (S10), there may be prepared a combined wafer in which the main surface of each SiC substrate 22 opposite to supporting layer 21 has an off orientation forming an angle of 5° or smaller relative to the <-2110> direction. Also in this case, an epitaxial growth layer or the like can be formed readily on SiC substrate 22.

It should be noted that the semiconductor device that can be manufactured in accordance with the method for manufacturing the semiconductor device in the present invention is not particularly limited as long as it is a semiconductor device having a front-side electrode and a backside electrode. For example, a MOSFET, an IGBT (Insulated Gate Bipolar Transistor), a JFET (Junction Field Effect Transistor), a diode, or the like can be manufactured in accordance with the manufacturing method in the present invention.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The method for manufacturing the semiconductor device in the present invention is advantageously applicable to a method for manufacturing a semiconductor device using a silicon carbide substrate.

REFERENCE SIGNS LIST

1: semiconductor device; 10: combined wafer; 11: first intermediate wafer; 12: second intermediate wafer; 21: supporting layer; 22: SiC substrate; 23: active layer; 24: front-side electrode; 25: backside electrode; 71: adhesive tape; 72: ring frame; 73: pressing member.

The invention claimed is:

1. A method for manufacturing a semiconductor device comprising the steps of:
   preparing a combined wafer in which a plurality of SiC substrates each made of silicon carbide single-crystal are arranged side by side when viewed in a planar view and main surfaces of said plurality of SiC substrates at one side are connected to each other by a supporting layer;
   fabricating a first intermediate wafer by forming an active layer on each of said SiC substrates of said combined wafer;
   fabricating a second intermediate wafer by forming a front-side electrode on said active layer of said first intermediate wafer;
   supporting said plurality of SiC substrates using an adhesive tape with said plurality of SiC substrates being arranged side by side when viewed in a planar view, by adhering to said adhesive tape a main surface of said second intermediate wafer on which said front-side electrode is formed;
   removing said supporting layer while supporting said plurality of SiC substrates of said second intermediate wafer using said adhesive tape with said plurality of SiC substrates being arranged side by side when viewed in a planar view;
   forming a backside electrode on the main surfaces of said SiC substrates exposed by the removal of said supporting layer;
   adhering an adhesive tape at the side thereof on which said backside electrode is formed, and removing said adhesive tape from the side thereof on which said front-side electrode is formed, so as to support said plurality of SiC substrates using said adhesive tape with said plurality of SiC substrates being arranged side by side when viewed in a planar view; and
   obtaining a plurality of semiconductor devices by cutting said SiC substrates in a thickness direction thereof while said SiC substrates are supported by said adhesive tape provided at the side on which said backside electrode is formed, with said SiC substrates being arranged side by side when viewed in a planar view.

2. The method for manufacturing the semiconductor device according to claim 1, wherein:
   the step of forming said backside electrode includes the steps of
      forming a metal layer on the main surfaces of said SiC substrates-exposed by the removal of said supporting layer, and
      heating said metal layer.

3. The method for manufacturing the semiconductor device according to claim 2, wherein in the step of heating said metal layer, said front-side electrode has a temperature maintained at 180° C. or smaller.

4. The method for manufacturing the semiconductor device according to claim 2, wherein in the step of heating said metal layer, said metal layer is locally heated.

5. The method for manufacturing the semiconductor device according to claim 4, wherein in the step of heating said metal layer, said metal layer is locally heated by irradiating said metal layer with a laser.

6. The method for manufacturing the semiconductor device according to claim 5, wherein said laser has a wavelength of 355 nm.

7. The method for manufacturing the semiconductor device according to claim 2, further comprising the step of replacing, after the step of forming said metal layer and before the step of heating said metal layer, said adhesive tape provided at the side of said SiC substrates on which said front-side electrode is formed, while maintaining the state in which said plurality of SiC substrates are arranged side by side when viewed in a planar view.

8. The method for manufacturing the semiconductor device according to claim 1, further comprising the step of replacing, after the step of removing said supporting layer and before the step of forming said backside electrode, said adhesive tape provided at the side of said SiC substrates on which said front-side electrode is formed, while maintaining the state in which said plurality of SiC substrates are arranged side by side when viewed in a planar view.

9. The method for manufacturing the semiconductor device according to claim 1, wherein as said adhesive tape, an adhesive tape having adhesive force to be reduced when being irradiated with ultraviolet rays is used.

10. The method for manufacturing the semiconductor device according to claim 1, wherein as said adhesive tape, an adhesive tape having adhesive force to be reduced when being heated is used.

* * * * *